United States Patent
Lutz

(10) Patent No.: US 12,117,291 B2
(45) Date of Patent: *Oct. 15, 2024

(54) DYNAMIC OFFSET AND AMPLITUDE TRACKER

(71) Applicant: Allegro MicroSystems, LLC, Manchester, NH (US)

(72) Inventor: Christophe Lutz, Schwindratzheim (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/342,041

(22) Filed: Jun. 27, 2023

(65) Prior Publication Data

US 2023/0341221 A1    Oct. 26, 2023

Related U.S. Application Data

(63) Continuation of application No. 17/501,120, filed on Oct. 14, 2021, now Pat. No. 11,733,025.

(51) Int. Cl.
G01B 7/30        (2006.01)
G01D 5/20        (2006.01)
(Continued)

(52) U.S. Cl.
CPC .................. *G01B 7/30* (2013.01); *G01D 5/20* (2013.01); *G01R 33/072* (2013.01);
(Continued)

(58) Field of Classification Search
CPC .......... G01B 7/30; G01D 5/20; G01R 33/072; G01R 33/091; G01R 33/093; G01R 33/098
See application file for complete search history.

(56) References Cited

U.S. PATENT DOCUMENTS 5,694,038 A    12/1997   Moody
6,100,680 A     8/2000   Vig
(Continued)

FOREIGN PATENT DOCUMENTS

EP    3742180    11/2020

OTHER PUBLICATIONS

Extended European Search Report dated Mar. 3, 2023 for European Application No. 22195797.0, 7 pages.
(Continued)

*Primary Examiner* — Alvaro E Fortich
(74) *Attorney, Agent, or Firm* — Daly, Crowley, Mofford & Durkee, LLP

(57) ABSTRACT

A method for use in a sensor, comprising: generating a signal that is indicative of an angular position of a rotating target, the signal being generated by at least one magnetic field sensing element; adjusting the signal to produce an adjusted signal, the signal being adjusted based on a current value of a first adjustment coefficient and a current value of a second adjustment coefficient, the first adjustment coefficient including a gain adjustment coefficient, and the second adjustment coefficient including an offset adjustment coefficient; generating an output signal based on the adjusted signal; and updating the first adjustment coefficient, the updating including replacing the current value of the first adjustment coefficient with a new value of the first adjustment coefficient, the updating being performed by minimizing a function that is based on the current value of the first adjustment coefficient and the current value of the second adjustment coefficient.

23 Claims, 12 Drawing Sheets

(51) Int. Cl.
*G01R 33/07* (2006.01)
*G01R 33/09* (2006.01)

(52) U.S. Cl.
CPC ......... *G01R 33/091* (2013.01); *G01R 33/093* (2013.01); *G01R 33/098* (2013.01)

(56) References Cited

U.S. PATENT DOCUMENTS

| | | | |
|---|---|---|---|
| 6,232,768 | B1 | 5/2001 | Moody et al. |
| 7,138,793 | B1 * | 11/2006 | Bailey ................. G01D 5/2449 |
| | | | 324/207.12 |
| 7,362,094 | B2 | 4/2008 | Voisine et al. |
| 8,350,563 | B2 | 1/2013 | Haas et al. |
| 11,125,837 | B2 | 9/2021 | Kulla |
| 2005/0140450 | A1 | 6/2005 | Pitz |
| 2006/0077083 | A1 | 4/2006 | Kiriyama et al. |
| 2013/0265037 | A1 * | 10/2013 | Friedrich ............... G01R 33/09 |
| | | | 324/207.2 |
| 2013/0265041 | A1 | 10/2013 | Friedrich et al. |
| 2019/0317175 | A1 * | 10/2019 | Polley ................ G01R 33/0035 |
| 2023/0079776 | A1 | 3/2023 | Zhou |
| 2023/0124351 | A1 | 4/2023 | Lutz |

OTHER PUBLICATIONS

Office Action dated Dec. 22, 2022 for U.S. Appl. No. 17/501,120; 27 pages.
Response to Office Action dated Dec. 22, 2022 filed on Mar. 20, 2023 for U.S. Appl. No. 17/501,120; 14 pages.
Notice of Allowance dated Apr. 27, 2023 for U.S. Appl. No. 17/,501,120; 17 pages.
Response to European Communication dated Apr. 24, 2023, filed on Oct. 26, 2023 for European Application No. 22195797.0; 19 pages.

* cited by examiner $$J(A_c, C_c) = \frac{1}{2}(A_c \sin(\theta) + C_c - x)^2 \quad \text{—210}$$

$$J'_{A_c}(A_c, C_c) = \sin(\theta)(A_c \sin(\theta) + C_c - x) \quad \text{—220}$$

$$J'_{C_c}(A_c, C_c) = A_c \sin(\theta) + C_c - x \quad \text{—230}$$

$$A_N = A_c - \alpha \sin(\theta)(A_c \sin(\theta) + C_c - x) \quad \text{—240}$$

$$C_N = A_c - A_c \sin(\theta) + C_c - x \quad \text{—250}$$

LEGEND
$A_c$ – Current Value of Gain Adjustment Coefficient 112
$C_c$ – Current Value of Offset Adjustment Coefficient 114
$A_N$ – New Value of Gain Adjustment Coefficient 112
$C_N$ – New Value of Offset Adjustment Coefficient 114
X – Sample of Signal 109A
$\theta$ – Angular Position of Target 101
$\alpha$ – Learning Rate

FIG. 2C $$J(A_c, C_c, \varphi_c, A_{hc}) = \frac{1}{2}\Big(A_c(1 + A_{hc}\sin(2\theta))\sin(\theta + \varphi_c) + C_c - x\Big)^2$$

— 610

$$k_n = k_c - \alpha \frac{\partial J}{\partial k}$$

— 620

LEGEND
A_c – Current Value of Gain Adjustment Coefficient 112
C_c – Current Value of Offset Adjustment Coefficient 114
φ_c – Current Value Value of Gain Adjustment Coefficient
A_hc – Current Value of Offset Adjustment Coefficient
A_n – New Value of Gain Adjustment Coefficient 112
C_n – New Value of Offset Adjustment Coefficient 114
φ_n – New Value Value of Gain Adjustment Coefficient
A_hn – New Value of Offset Adjustment Coefficient
α – Learning Rate
K_c ∈ {A_c, C_c, φ_c, A_hc}
K_n ∈ {A_n, C_n, φ_n, A_hn}

800
- 802: RETRIEVE A SAMPLE OF A SIGNAL
- 804: RETRIEVE THE CURRENT VALUE OF AN ADJUSTMENT COEFFICIENT
- 806: CALCULATE A NEW VALUE OF THE ADJUSTMENT COEFFICIENT
- 808: REPLACE THE CURRENT VALUE OF THE ADJUSTMENT COEFFICIENT WITH THE NEW VALUE

FIG. 7

700
- 702: GENERATE A SIGNAL THAT IS AT LEAST IN PART INDICATIVE OF AN ANGULAR POSITION OF A ROTATING TARGET
- 704: ADJUST THE SIGNAL BASED ON AN ADJUSTMENT COEFFICIENT
- 706: GENERATE AN OUTPUT SIGNAL
- 708: DOES THE CURRENT ANGULAR POSITION OF THE ROTATING TARGET MATCH ANY ANGULAR POSITION IN A SET OF ONE OR MORE ANGULAR POSITIONS?
- 710: UPDATE THE ADJUSTMENT COEFFICIENT (EXPANDED IN FIG. 8)

DYNAMIC OFFSET AND AMPLITUDE TRACKER

CLAIM OF PRIORITY

The present application is filed as a Continuation application of U.S. application Ser. No. 17/501,120, filed on Oct. 14, 2021, and entitled: DYNAMIC OFFSET AND AMPLITUDE TRACKER, which is herein incorporated by reference in its entirety.

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, method is provided for use in a sensor, comprising: generating a signal that is indicative of an angular position of a rotating target, the signal being generated by at least one magnetic field sensing element; adjusting the signal to produce an adjusted signal, the signal being adjusted based on a current value of a first adjustment coefficient and a current value of a second adjustment coefficient, the first adjustment coefficient including a gain adjustment coefficient, and the second adjustment coefficient including an offset adjustment coefficient; generating an output signal based on the adjusted signal; and updating the first adjustment coefficient, the updating including replacing the current value of the first adjustment coefficient with a new value of the first adjustment coefficient, the updating being performed by minimizing a function that is based on the current value of the first adjustment coefficient and the current value of the second adjustment coefficient.

According to aspects of the disclosure, a method is provided for use in a sensor, comprising: generating a signal that is indicative of an angular position of a rotating target, the signal being generated by at least one magnetic field sensing element; adjusting the signal to produce an adjusted signal, the signal being adjusted based on a current value of a first adjustment coefficient and a current value of a second adjustment coefficient, the first adjustment coefficient including a gain adjustment coefficient, and the second adjustment coefficient including an offset adjustment coefficient; generating an output signal based on the adjusted signal; and updating the first adjustment coefficient, the updating including replacing the current value of the first adjustment coefficient with a new value of the first adjustment coefficient, the updating being performed by minimizing a function that is based on the current value of the first adjustment coefficient and the current value of the second adjustment coefficient.

According to aspects of the disclosure, a sensor is provided, comprising: at least one magnetic field sensing element that is arranged to generate a signal indicative of an angular position of a rotating target; and a processing circuitry configured to: adjust the signal to produce an adjusted signal, the signal being adjusted based on a current value of a first adjustment coefficient; generate an output signal based on the adjusted signal; and update the first adjustment coefficient, the updating including replacing the current value of the first adjustment coefficient with a new value of the first adjustment coefficient, the updating being performed by minimizing a function that is based on the current value of the first adjustment coefficient, wherein the first adjustment coefficient includes a gain adjustment coefficient, and the function has the form of:

$$J(A_c, C_c, \varphi, A_{hc}) = \frac{1}{2}(A_c(1 + A_{hc}\sin(2\theta))\sin(\theta + \varphi_c) + C_c - x)^2$$

where $A_c$ is the current value of the gain adjustment coefficient, $C_c$ is a current value of an offset adjustment coefficient, $\theta$ is a current angular position of the rotating target, $A_h$ is a current value of a harmonic adjustment coefficient, $\varphi_c$ is a current value of a phase adjustment coefficient, and x is a sample of the signal.

According to aspects of the disclosure, a sensor is provided, comprising: at least one magnetic field sensing element that is arranged to generate a signal indicative of an angular position of a rotating target; and a processing circuitry configured to: adjust the signal to produce an adjusted signal, the signal being adjusted based on a current value of a first adjustment coefficient and a current value of a second adjustment coefficient, the first adjustment coefficient including a gain adjustment coefficient, and the second adjustment coefficient including an offset adjustment coefficient; generate an output signal based on the adjusted signal; and update the first adjustment coefficient, the updating including replacing the current value of the first adjustment coefficient with a new value of the first adjustment coefficient, the updating being performed by minimizing a function that is based on the current value of the first adjustment coefficient and the current value of the second adjustment coefficient.

BRIEF DESCRIPTION OF THE DRAWINGS

The foregoing features may be more fully understood from the following description of the drawings in which:

FIG. 2C is a diagram of a model for updating adjustment coefficients, according to aspects of the disclosure;

FIG. 6 is a diagram of a model for updating adjustment coefficients, according to aspects of the disclosure;

FIG. 7 is a flowchart of an example of a process, according to aspects of the disclosure;

FIG. 8 is a flowchart of an example of a process, according to aspects of the disclosure.

DETAILED DESCRIPTION

Figure 1A:
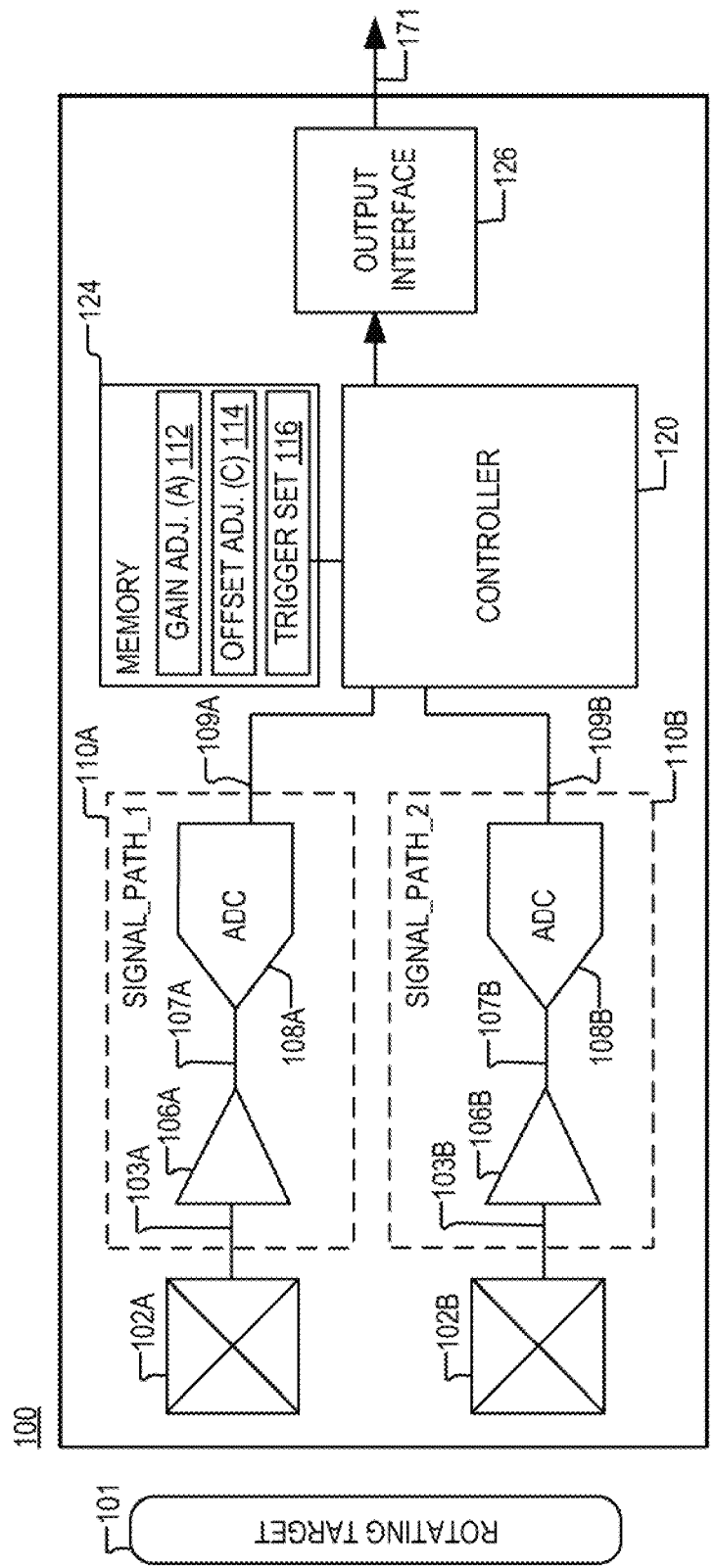
FIG. 1A is a diagram of an example of a sensor, according to aspects of the disclosure.

FIG. 1A is a diagram of an example of a sensor 100, in accordance with one implementation. In this implementation, the sensor 100 adjusts the gain and offset of signals that are generated by sensing modules 102A and 102B in the digital domain. The sensor 100 may include an angle sensor, and it may be configured to detect a magnetic field that is associated with a rotating target 101. The sensor 100 may be configured to generate an output signal 171 that is at least in part indicative of the angular position of the target 101. By way of example, the output signal 171 may indicate one or more of a current angular position of the rotating target 101, speed of rotation of the rotating target 101, direction of rotation of the rotating target 101, acceleration of the rotating target 101, and/or any other characteristic of the movements of the rotating target 101.

The rotating target 101 may include one more of a permanent magnet (e.g., a 2-pole magnet or a multi-pole magnet), a gear, a transmitting coil, a metal object, the rotor of an electric motor, and/or any other suitable type of target. The magnetic field that is associated with the rotating target 101 may include a magnetic field that is generated by the rotating target 101, a magnetic field that is generated by a back bias magnet and modulated by the rotating target 101, a magnetic field that is induced in the rotating target 101 by another magnetic field source, and/or any other suitable type of magnetic field.

As illustrated, the sensor 100 may include a first sensing module 102A, a first signal path 110A, a second sensing module a 102B, a second signal path 110B, a controller 120, a memory 124, and an output interface 126.

The sensing module 102A may include one or more magnetic field sensing elements. Each of the magnetic field sensing elements may include one or more of a giant magnetoresistor (GMR), a tunnel magnetoresistor (TMR), a Hall effect element, a receiving coil, and/or any other suitable type of magnetic field sensing element. Each of the magnetic field sensing elements in the sensing module 102A may have a first axis of maximum sensitivity.

The sensing module 102B may include one or more magnetic field sensing elements. Each of the magnetic field sensing elements may include one or more of a giant magnetoresistor (GMR), a tunnel magnetoresistor (TMR), a Hall effect element, and/or any other suitable type of magnetic field sensing element. Each of the magnetic field sensing elements may have a second axis of maximum sensitivity that is perpendicular to the first axis of maximum sensitivity. As a result of this arrangement, a signal generated, at least in part, by one of sensing modules 102A-B may have sinusoidal waveform, and a signal generated, at least in part, by the other one of sensing modules 102A-B may have a cosine waveform.

The signal path 110A may include an amplifier 106A and an analog-to-digital converter (ADC) 108A. The signal path 110B may include an amplifier 106B and an ADC 108B. The controller 120 may include any suitable type of processing circuitry, such as an application-specific integrated circuit (ASIC), a CORDIC processor, a special-purpose processor, synchronous digital logic, asynchronous digital logic, a general-purpose processor (e.g., a MIPS processor, an x86 processor), etc. The memory 124 may include any suitable type of volatile and/or non-volatile memory. By way of example, the memory 124 may include a random-access memory (RAM), a dynamic random-access memory (DRAM), an electrically-erasable programmable read-only memory (EEPROM), and/or any other suitable type of memory. The output interface 126 may include any suitable type of interface for outputting the output signal 171. For example, the output interface 126 may include one or more of a current generator, an Inter-Integrated Circuit (I2C) interface, a Controller Area Network (CAN bus) interface, WiFi interface, a local-area network interface, a 5G wireless interface, and/or any other suitable type of interface.

In operation, the sensing module 102A may generate a signal 103A in response to a magnetic field associated with the rotating target 101. The amplifier 106A may amplify the signal 103A to produce a signal 107A. The ADC 108A may digitize the signal 107A to produce a signal 109A, which is subsequently provided to the controller 120.

The sensing module 102B may generate a signal 103B in response to a magnetic field associated with the rotating target 101. The amplifier 106B may amplify the signal 103B to produce a signal 107B. The ADC 108B may digitize the signal 107B to produce a signal 109B, which is subsequently provided to the controller 120.

The memory 124 may store a gain adjustment coefficient 112, an offset adjustment coefficient 114, and a trigger set 116. The gain adjustment coefficient 112 may be used by the controller 120 to adjust the gain of the signal 109A (and/or signal 109B). The offset adjustment coefficient may be used by the controller 120 to offset the signal 109A (and/or signal 109B). According to the example of FIG. 1A, the gain and offset of the signal 109A (and/or signal 109B) are adjusted in the digital domain. Adjusting the gain of the signal 109A may include multiplying the signal 109A by the gain adjustment coefficient 112. Offsetting the signal 109A may including adding the offset adjustment coefficient 114 to the signal 109A. It will be understood that the present disclosure is not limited to any specific method for adjusting a signal (generated by a magnetic field sensing element) based on an offset adjustment coefficient and/or a gain adjustment coefficient.

The controller 120 may normalize signals 109A and 109B, after which the controller 120 may use the normalized signals 109A and 109B to determine the angular position of the rotating target 101 in accordance with Equation 1 below:

$$\theta = a\tan\left(\frac{S_{109A}}{S_{109B}}\right) \qquad (1)$$

where θ is the angular position of the rotating target 101, $S_{109A}$ is the value of signal 109A and $S_{109B}$ is the value of signal 109B. After the angular position of the rotating target 101 is determined, the controller 120 may generate the output signal 171 based on the determined angular position.

In addition, the controller 120 may execute a process for updating the gain adjustment coefficient 112 and an offset adjustment coefficient 114. The process relies on gradient descent to identify optimal (or improved) values for the gain adjustment coefficient 112 and the offset adjustment coefficient. The process is discussed further below with respect to FIGS. 2A-4. Although the process is discussed in the context of a gain adjustment coefficient and an offset adjustment coefficient, it will be understood that the process can be used to update any suitable type of signal adjustment coefficient.

Figure 1B:
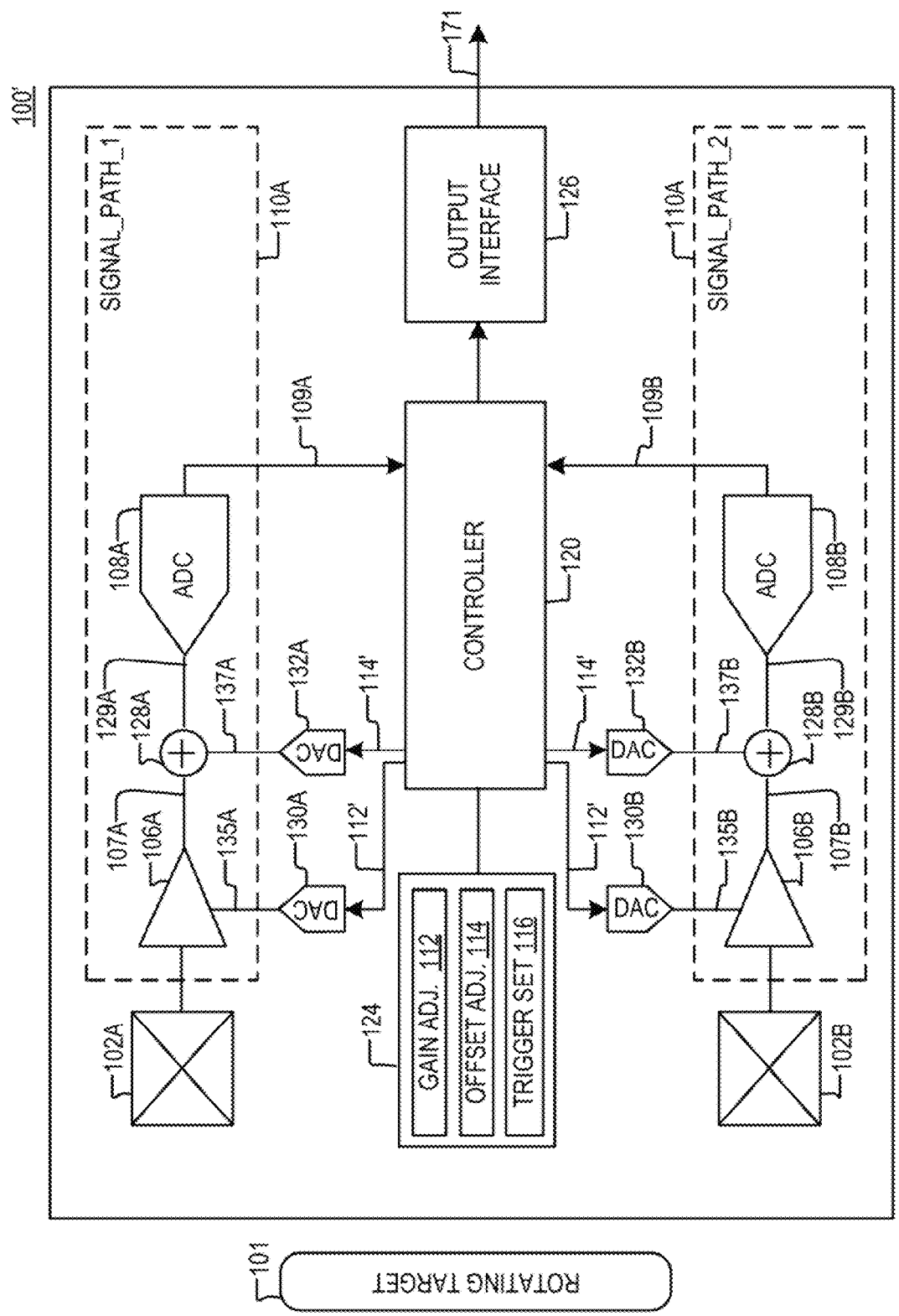
FIG. 1B is a diagram of an example of a sensor, according to aspects of the disclosure.

FIG. 1B is a diagram of an example of a sensor 100, in accordance with another implementation.

According to the example of FIG. 1B, the signal path 110A includes an addition unit 128A for adjusting the offset of the signal 107A, and the amplifier 106A has a variable gain. Furthermore, in the example of FIG. 1B, the signal path 110B includes an addition unit 128B for adjusting the offset of the signal 107B, and the amplifier 106B has a variable gain.

According to the example of FIG. 1B, the controller 120 may generate a signal 112' and provide the signal 112' to each of a digital-to-analog converter (DAC) 130A and a DAC 130B. The signal 112' may be equal to (or otherwise based on) the value of the gain adjustment coefficient 112. The DAC 130A may convert the signal 112' to analog form to produce a signal 135A, which is subsequently applied at a gain control terminal of the amplifier 106A. The DAC 130B may convert the signal 112' to analog form to produce a signal 135B, which is subsequently applied at a gain control terminal of the amplifier 106B.

According to the example of FIG. 1B, the controller 120 may generate a signal 114' and provide the signal 114' to each of a digital-to-analog converter (DAC) 132A and a DAC 132B. The signal 114' may be equal to (or otherwise based on) the value of the offset adjustment coefficient 114. The DAC 132A may convert the signal 114' to analog form to produce a signal 137A, which is subsequently applied to addition unit 128A. The addition unit 128A may add the signal 137A to the signal 107A to produce a signal 129A, which is subsequently provided to the ADC 108A. The DAC 132B may convert the signal 114' to analog form to produce a signal 137B, which is subsequently applied to addition unit 128B. The addition unit 128B may add the signal 137B to the signal 107B to produce a signal 129B, which is subsequently provided to the ADC 108B.

The implementation of FIG. 1B differs from the implementation of FIG. 1A in that the sensor 100 adjusts the gain and offset of signals that are generated by sensing modules 102A and 102B in the analog domain. In this regard, it will be understood that FIG. 1B is provided to illustrate that the controller 120 is not limited to using the gain adjustment coefficients 112 and 114 to adjusting the gain and offset of a signal (generated by a magnetic field sensing element) in the digital domain. FIG. 1B, in other words, illustrates that the gain adjustment coefficient 112 and the offset adjustment coefficient 114 may be used to adjust the gain and/or offset of a signal (generated by a magnetic field sensing element) in the analog domain.

Figure 1C:
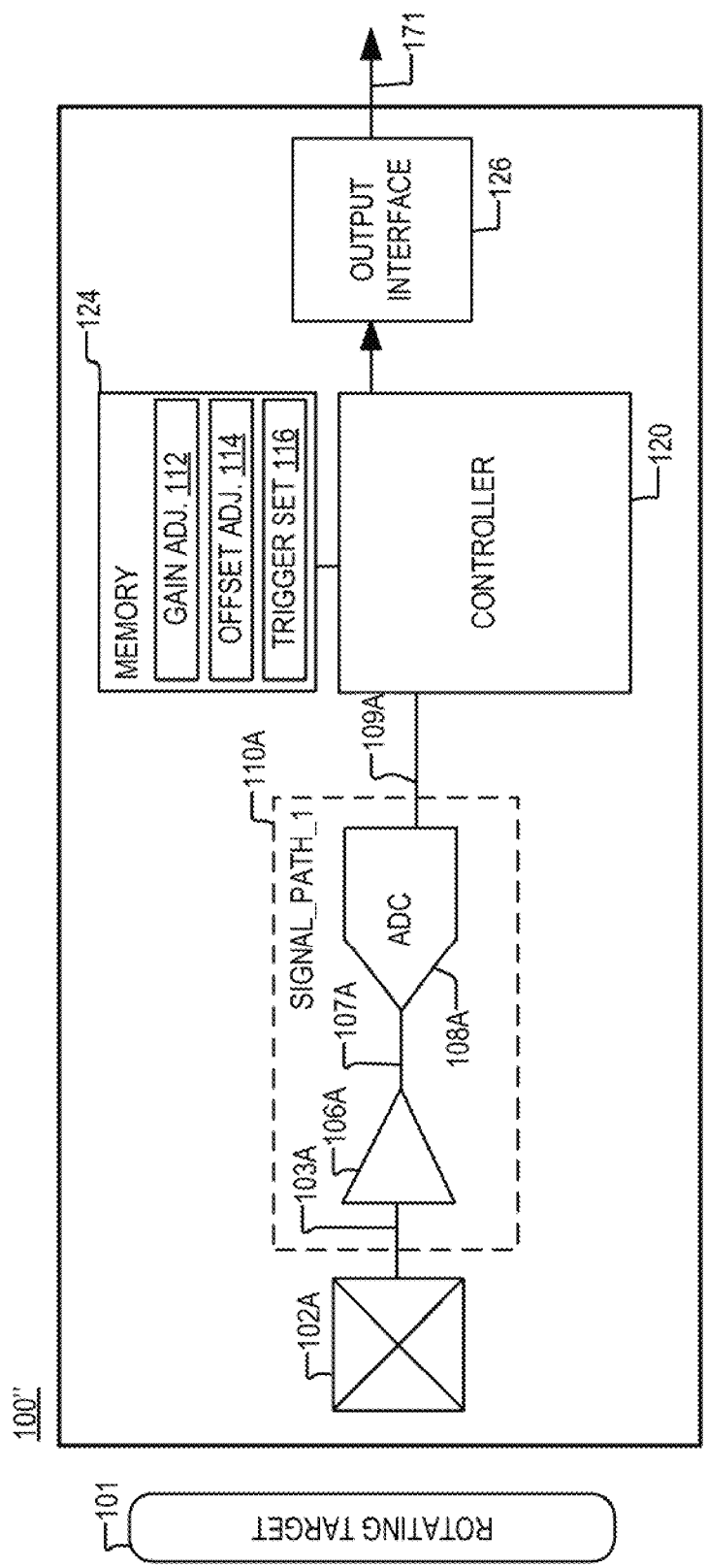
FIG. 1C is a diagram of an example of a sensor, according to aspects of the disclosure.

FIG. 1C is a diagram of an example of a sensor 100, in accordance with yet another implementation. In this implementation, the second signal path 110B is omitted and the controller 120 uses a different method to determine the angular position of the rotating target. More specifically, the controller counts the peaks in the signal 109A and determines the current angular position of the rotating target in accordance with Equation 2 below:

$$\theta = (N\%P) * \left(\frac{360}{P}\right) \qquad (2)$$

where N is the number of the most recent peak in the signal 109A, and P is the number of peaks that occur in the signal 109A during each full rotation of the rotating target 101. FIG. 1C is provided to illustrate that the techniques for updating the values of the gain adjustment coefficient 112 and 114 (which is discussed with respect to FIGS. 2A-4) can be used on any type of magnetic field sensor, irrespective of how the magnetic signal sensor processes one or more signals that are generated by magnetic field sensing elements, and irrespective of the number of channels that are available in the sensor. Furthermore, although in the examples of FIGS. 1A-C the sensor 100 is an angle sensor, it will be understood that the techniques for updating the values of the gain adjustment coefficient 112 and 114 can be used on any type of magnetic field sensor, such as a current sensor, a position sensor, a proximity sensor, etc.

In some respects, each of signals 107A, 129A, and 109A is generated based on a signal 103A, which is generated by the sensing module 102A. Under the nomenclature of the present disclosure, each of signals 103A, 107A, 129A, and 109A may be referred to as a "signal that is generated at least in part by a magnetic field sensing element" and/or "a signal that is at least in part indicative of the angular position of a target". Furthermore, each of signals 107B, 129B, and 109B is generated based on a signal 103B, which is generated by the sensing module 102B. Under the nomenclature of the present disclosure, each of signals 103B, 107B, 129B, and 109B may be referred to as a "signal that is generated at least in part by a magnetic field sensing element" and/or "a signal that is at least in part indicative of the angular position of a target". In the example of FIGS. 1A-B, signals generated, at least in part, by the sensing modules 102A-B are adjusted based on the same adjustment coefficients. However, it will be understood that in practice, the signal generated, at least in part, by the sensing module 102A may be adjusted based on one or more first adjustment coefficients, and the signal generated, at least in part, by the sensing module 102B may be updated based on one or more second adjustment coefficients that are different from the first adjustment coefficients. Any of the first and/or second adjustment coefficients may be updated in accordance with the techniques that are discussed further below.

Figure 2A:
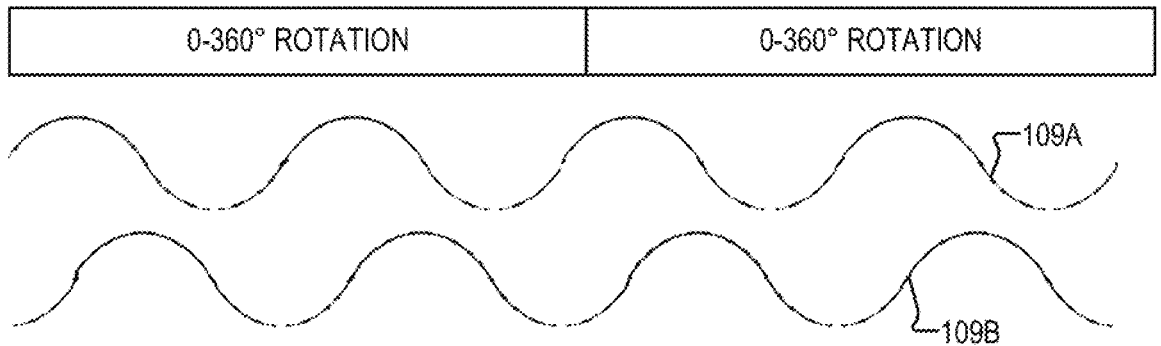
FIG. 2A is a plot of signals generated by magnetic field sensing elements, according to aspects of the disclosure.
Figure 2B:
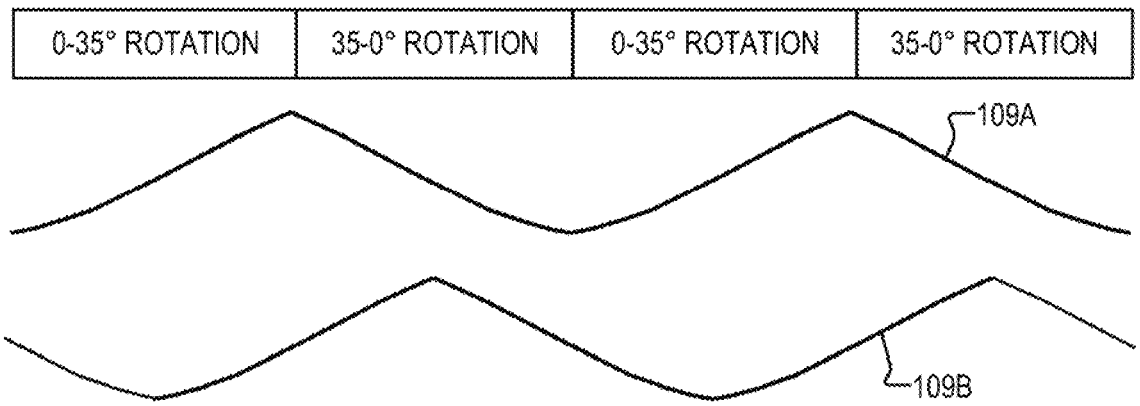
FIG. 2B is a plot of signals generated by magnetic field sensing elements, according to aspects of the disclosure.

FIG. 2A is a plot of waveforms of signals 109A and 109B, which result when the rotating target 101 is rotating continuously in the same direction. FIG. 2A illustrates that when the target 101 rotates in the same direction, well-defined peaks will be present in the signals 109A and 109B. FIG. 2B is a plot of waveforms of signals 109A and 109B, which result when the rotating target 101 rotates back and forth by 35 degrees. An example of a target that would exhibit this pattern of rotation is a magnet attached to the rotor of a motor that actuates the windshield wipers of an automobile. FIG. 2B illustrates that some patterns of movement of the target 101 may result in the signals 109A and 109B lacking well-defined peaks. As is discussed further below, one advantage of the techniques for adjusting the gain adjustment coefficient 112 and the offset adjustment coefficient 114 is that it works with both signals that have well-defined peaks, as well as with signals that lack well-defined peaks. This is in contrast to some existing techniques for the adjustment of gain and offset adjustment coefficients, which require the presence of well-defined peaks.

FIG. 2C is a diagram of an example of a model for adjusting the gain adjustment coefficient 112 and/or the offset adjustment coefficient 114. The technique is based on minimizing the value of a cost function 210. In the present example, the cost function 210 is defined by Equation 3 below:

$$J(A_c, C_c) = \frac{1}{2}(A_c \sin(\theta) + C_c - x)^2 \quad \text{(Eq. 3)}$$

where $A_c$ is the current value of the gain adjustment coefficient 112, $C_c$ is the current value of the offset adjustment coefficient 114, $\theta$ is the current angular position of the rotating target, and x is a sample of the signal. Under the nomenclature of the present disclosure, the current value of the gain adjustment coefficient 112 may be the value for the gain adjustment coefficient that is currently stored in the memory 124 (shown in FIGS. 1A-C). The current value of the offset adjustment coefficient 114 is the value for the offset adjustment coefficient that is currently stored in the memory 124 (shown in FIGS. 1A-C).

In the present example, the cost function 210 is based on the error that is present in a single sample of the signal 109A. However, it will be understood that the present disclosure is not limited to any specific type of cost function. For example, in some implementations, the cost function 210 may be based on the error that is present in more than one sample of the signal 109A. Furthermore, although in the present example, the cost function 210 is based on both the gain adjustment coefficient and the offset adjustment coefficient, alternative implementations are possible in which the cost function is based on only one of the gain adjustment coefficient and the offset adjustment coefficient. Furthermore, alternative implementations are possible in which the cost function is based on any suitable type of adjustment coefficient.

Further shown in FIG. 2C are the values of the partial derivatives of the cost function 210. Specifically, function 220 is the partial derivative of the cost function 210 with respect to the gain adjustment coefficient 112. And function 230 is the partial derivative of the cost function 210 with respect to the offset adjustment coefficient 114. In the present examples, functions 220 and 230 are defined by Equations 4 and 5, respectively:

$$J_{A_c}'(A_c, C_c) = \sin(\theta)(A_c \sin(\theta) + C_c - x) \quad (4)$$

$$J_{C_c}'(A_c, C_c) = A_c \sin(\theta) + C_c - x \quad (5)$$

Further shown in FIG. 2C are functions 240 and 250. Function 240 is based on function 220, and it may be used to update the value of the gain adjustment coefficient 112. Function 250 is based on function 230, and it may be used to update the value of the offset adjustment coefficient 112. In the present examples, functions 240 and 250 are defined by Equations 6 and 7, respectively:

$$A_N = A_c - \alpha \sin(\theta)(A_c \sin(\theta) + C_c - x) \quad (6)$$

$$C_N = C_c - a(A_c \sin(\theta) + C_c - x) \quad (7)$$

where $A_N$ is a new value of the gain adjustment coefficient 112, $C_N$ is a new value of the offset adjustment coefficient 114, and $\alpha$ is a learning rate coefficient. The learning rate coefficient is a parameter that scales the updates to the gain adjustment coefficient 112 and the offset adjustment coefficient. A too-small learning rate can make convergence slow, while a too-high one can create oscillations or even yield divergence. In the present example, the value of the learning rate sets how aggressively the values of the gain adjustment coefficient 112 and the offset adjustment coefficient 114 are updated. According to the present example, $\alpha = 0.5$. However, it will be understood that the present disclosure is not limited to any specific value of the learning rate coefficients. Additionally the learning rate can decay or vary over time.

Figure 2D:
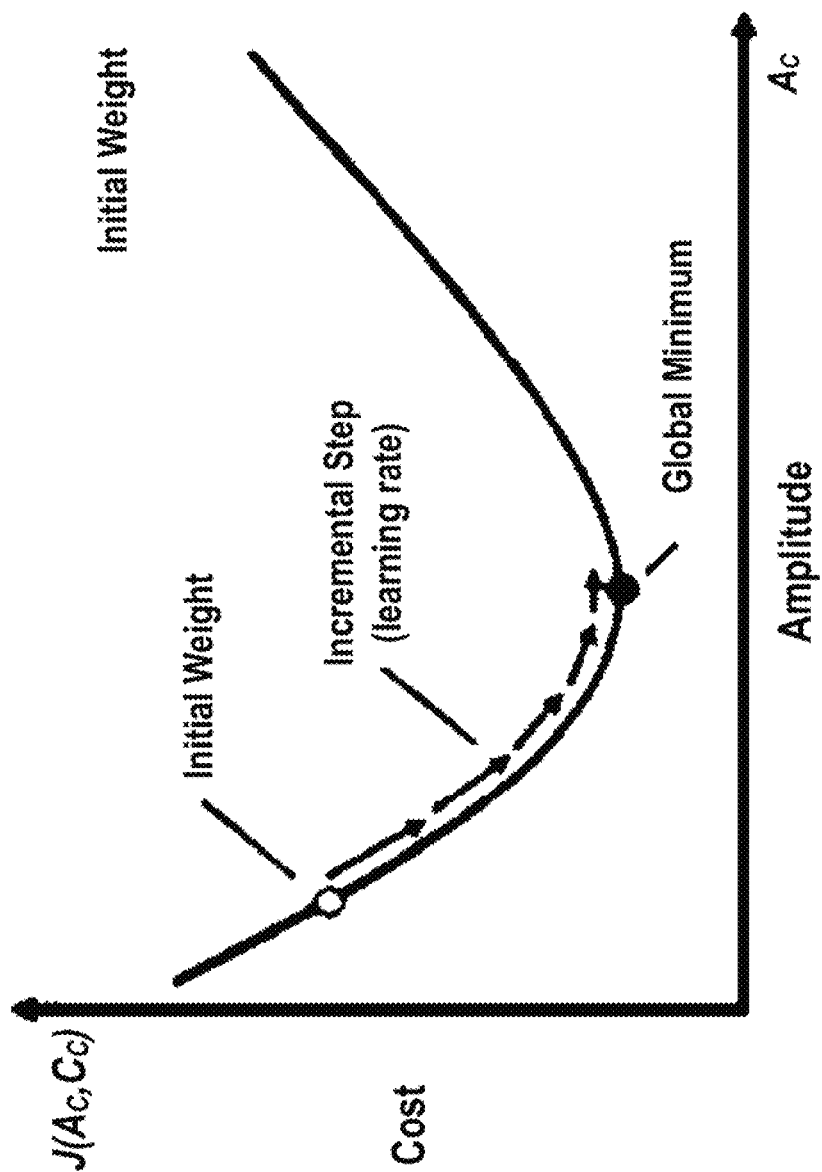
FIG. 2D is a plot illustrating aspects of the model of FIG. 2C, according to aspects of the disclosure.

In some respects, the model depicted in FIG. 2C uses gradient descent to find optimal (or improved) values of the gain adjustment coefficient 112 and the offset adjustment coefficient 114 by minimizing the cost function 210. As used throughout the disclosure, the phrase "minimizing a cost function" shall refer to one or both of: (i) finding (or attempting to find) new values for parameters of the cost function (e.g., a new value of a gain adjustment coefficient and/or a new value of an offset adjustment coefficient) that yield a global (or local) minimum of the cost function or (ii) finding (or attempting to find) new values for parameters of the cost function (e.g., a new value of a gain adjustment coefficient and/or a new value of an offset adjustment coefficient) that yield a value of the cost function that is closer to the global (or local) minimum of the cost function than a value yielded by old values of the parameters of the cost function (e.g., an old value of a gain adjustment coefficient and/or an old value of an offset adjustment coefficient). FIG. 2D shows a plot that illustrates how gradient descent can be used to arrive at the value for the gain adjustment coefficient 112, which yields the minimum value of the cost function 210. The plot illustrates that the gain adjustment coefficient 112 and/or the offset adjustment coefficient 114 may be updated in incremental steps, which leads to the value of the cost function 210 being minimized.

In some implementations, the updating of the gain adjustment coefficient 112 and/or the offset adjustment coefficient 114 with new values may be triggered by the rotating target 101 reaching a predetermined angular position. Whether the rotating target 101 has reached the predetermined angular position may be determined based on the current values of—a signal that is generated at least in part by the sensing module 102A, a signal that is generated at least in part by the sensing module 102B, the output signal 171, and or any other suitable signal that is generated within the sensor 100.

In some respects, using the angular position of the rotating target 101 as a trigger for updating the values of the gain adjustment coefficient 112 and/or the offset adjustment coefficient 114 allows the updates to be sufficiently spaced across the characteristic of the signals indicative of an angular position. Spacing the updates ensures the angle error minimization is performed over the full operating range of the sensor. The angles at which the update is more often triggered will inherently receive more adjustment.

Figures 2E, 2F:
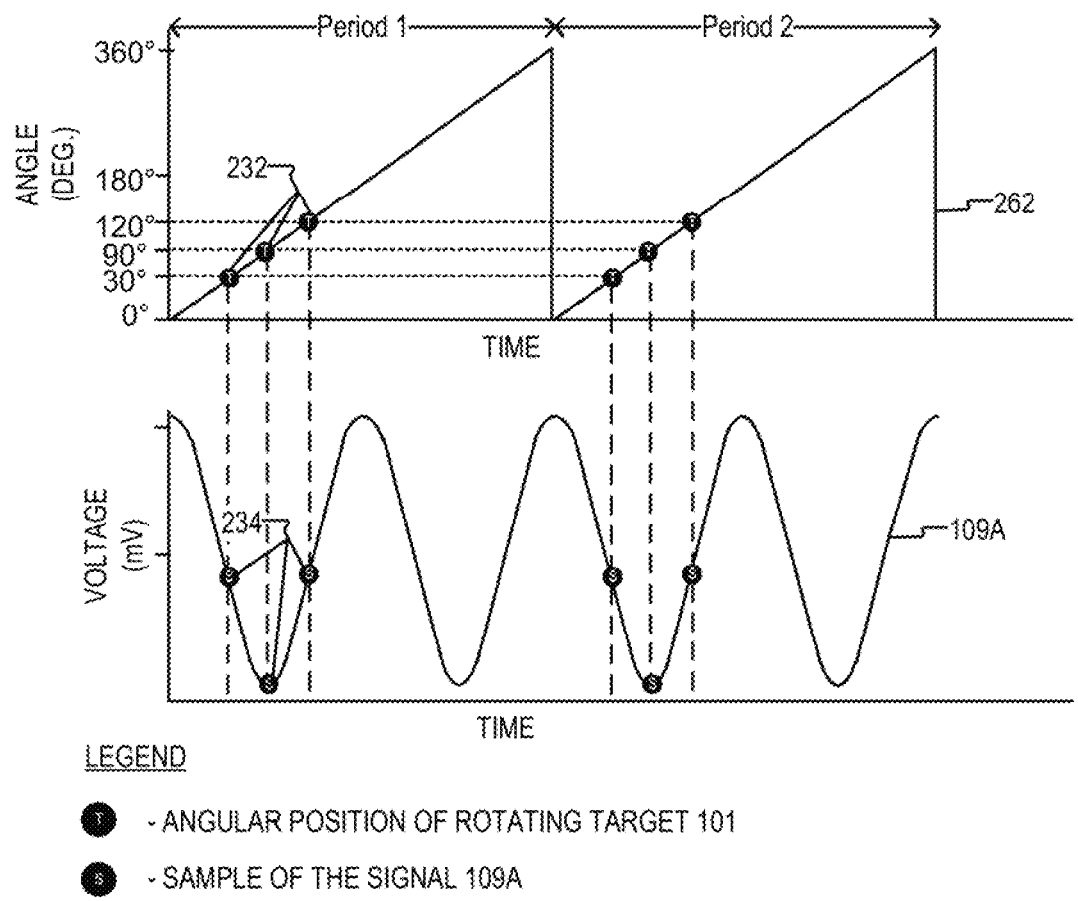
FIG. 2E is a diagram of an example of a set of angular positions of a rotating target that trigger the updating of a gain adjustment and/or an offset adjustment coefficient, according to aspects of the disclosure.
FIG. 2F is a plot of an example of a condition that triggers the updating of a gain adjustment and/or an offset adjustment coefficient, according to aspects of the disclosure.

FIG. 2E shows an example of the trigger set 116. In the example of FIG. 2E, the trigger set 116 provides that the gain adjustment coefficient 112 and/or the offset adjustment coefficient 114 may be updated only when the rotating target 101 is positioned at 30 degrees, 90, degrees, and 120 degrees. Although in the example of FIG. 2E each element in the trigger set 116 is an angle value, it will be understood that alternative implementations are possible in which any of the elements in the trigger set 116 is another quantity that is at least in part indicative of the angular position of the rotating target 101. For example, in some implementations, any of the elements in the trigger set 116 may be the value of the signal 109A, which corresponds to a predetermined angular position.

In some implementations, instead of storing the trigger set 116 in memory, the controller 120 may implement a state machine to determine whether the current value of the signal 109A should trigger an update of the gain adjustment coefficient 112 and/or offset adjustment coefficient 114. FIG. 2F is a plot illustrating values of the signal 109A that would trigger the updating of the gain adjustment coefficient 112 and/or the offset adjustment coefficient 114. Shown in FIG. 2F is a plot 262 of the angular position of the target 101 with respect to time. Further shown in FIG. 2F is a plot of the signal 109A. The plot 262 of the angular position of the target 101 is marked with markers 232, which correspond to different ones of the angular positions in the trigger set 116. The plot of the signal 109A is marked with markers 234. Each of the markers 234 corresponds to a sample of the signal 109A, which corresponds to one of the angular positions in the trigger set 116, and which could be used to update the coefficients 112 and/or 114. Due to the periodic nature of the waveform of the signal 109A, the values of the signal 109A at each of the points denoted by markers 234 may map to more than one angular position, which necessitates the use of a state machine to determine whether the current value of the signal 109A should trigger an update of the gain adjustment coefficient 112 or the offset adjustment coefficient 114. Together, FIGS. 2E and 2F illustrate that the updating of the gain adjustment coefficient 112 and/or offset adjustment coefficient 114 may be triggered by one or more of: (i) the current angular position of the rotating target 101 matching any of the members of a set of one or more predetermined angular positions, or (ii) the current value of the signal 109A matching any of the members of a set of one or more signal values that correspond to specific angular positions of the rotating target 101. As can be readily appreciated, in some implementations, the signal 109B or another signal that is generated at least in part by one of sensing elements 102A-B may be used to determine if an update of the coefficients 112 and 114 should be performed.

Figure 3:
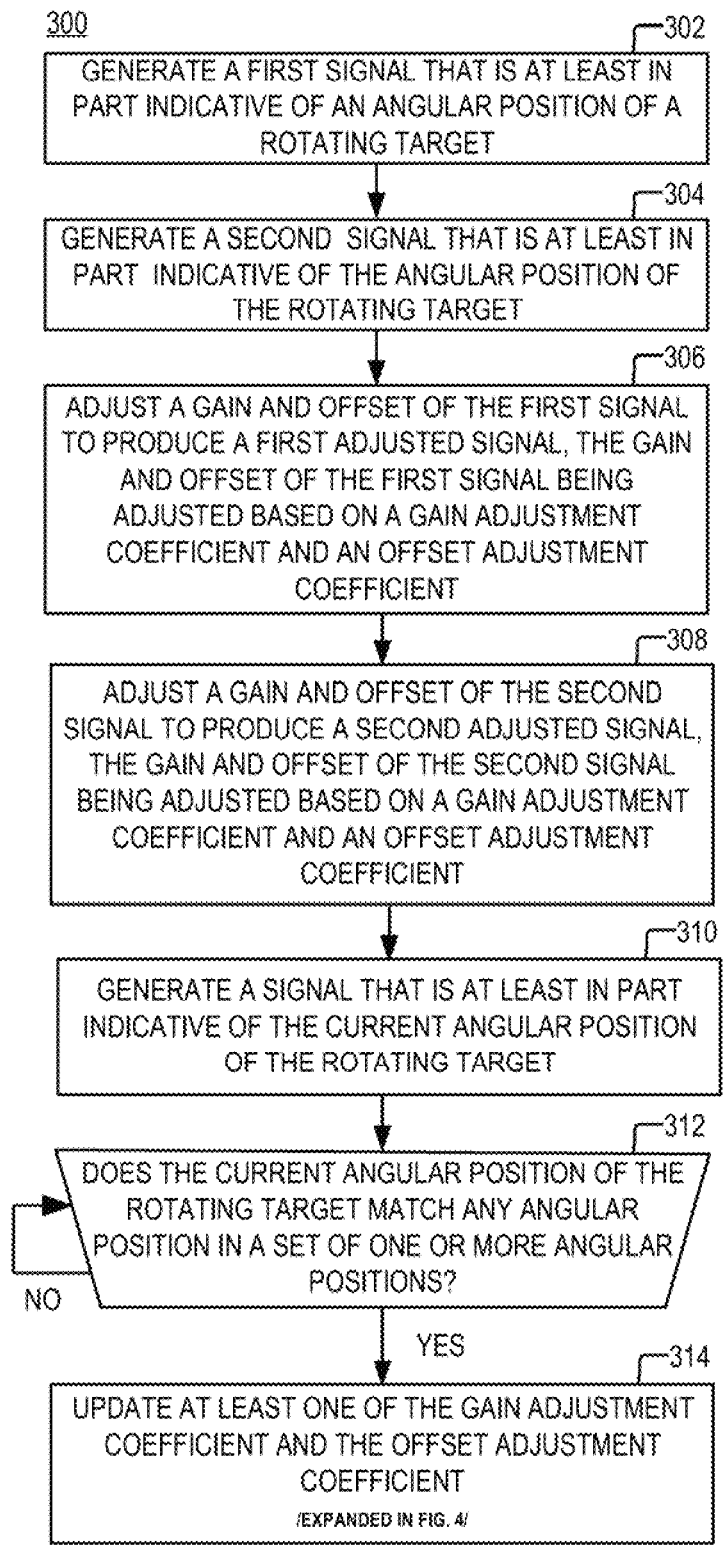
FIG. 3 is a flowchart of an example of a process, according to aspects of the disclosure.

FIG. 3 is a flowchart of an example of a process 300 that is performed by the sensor 100, according to aspects of the disclosure.

At step 302, a first signal is generated that is at least in part indicative of the angular position of the rotating target 101. Depending on the implementation of the sensor 100, the first signal may be the same or similar to signal 103A or signal 109A.

At step 304, a second signal is generated that is at least in part indicative of the angular position of the rotating target 101. Depending on the implementation of the sensor 100, the second signal may be the same or similar to signal 103B or signal 109B.

At step 306, the controller 120 adjusts the gain and offset of the first signal to produce a first adjusted signal. The gain and offset of the first signal may be adjusted based on the gain adjustment coefficient 112 and the offset adjustment coefficient 114. As noted above, the gain of the first signal may be adjusted in the digital domain or in the analog domain.

At step 308, the controller 120 adjusts the gain and offset of the second signal to produce a second adjusted signal. The gain and offset of the second signal may be adjusted based on the gain adjustment coefficient 112 and the offset adjustment coefficient 114. As noted above, the gain of the second signal may be adjusted in the digital domain or in the analog domain. Although in the present example both the second signal is adjusted based on the same gain and offset adjustment coefficients as the first signal, it will be understood that in many practical applications the second signal may be adjusted based on different gain and offset adjustment coefficients.

At step 310, the controller 120 generates an output signal that is at least in part indicative of the angular position of the rotating target 101. The output signal may be the same or similar to the output signal 171, which is shown in FIGS. 1A-C.

At step 312, the controller 120 detects if the current angular position of the rotating target 101 matches any angular position in a set of one or more angular positions. In some implementations, the controller 120 may detect if the current angular position matches any member of the trigger set 116. For example, the controller 120 may perform a search of the memory 124 to determine whether the trigger set 116 includes an element that matches the current angular position of the rotating target 101. In an alternative implementation, as noted above, the controller 120 may use a state machine to determine whether the current value of the first signal (and/or the current value of the second signal) corresponds to any angular positions in a set of one or more angular positions (such as the trigger set 116). Under the nomenclature of the present disclosure, the current angular position of the rotating target matches any angular position of the set of one or more angular position if the angular position from the set is the same as (or within a predetermined distance from) the current angular position. For example, the current angular position of the rotating target 101 may match any of the angular positions in the set if the rotating target 101 has crossed (i.e., rotated past) the position. If the current angular position of the rotating target 101 is determined to match any angular position in a set of one or more angular positions, the process 300 proceeds to step 314. Otherwise, step 314 is repeated.

At step 314, at least one of the gain adjustment coefficient and the offset adjustment coefficient is updated. In some implementations, at least one of the gain adjustment coefficient and the offset adjustment coefficient may be updated in accordance with the model that is discussed with respect to FIG. 2C. Additionally or alternatively, in some implementations, at least one of the gain adjustment coefficient 112 and the offset adjustment coefficient 114 may be updated by executing a process 400, which is discussed further below with respect to FIG. 4.

Although in the example of FIG. 3 the second signal is adjusted based on the gain adjustment coefficient 112 and the offset adjustment coefficient 114, alternative implementations are possible in which the second signal is adjusted based on a different gain adjustment coefficient and the offset adjustment coefficient. In such implementations, the offset and gain adjustment coefficients may also be updated by using the model of FIG. 2C and/or executing the process 400. Although in the example of FIG. 3 both a first signal and a second signal are used to determine the angular position of the rotating target 101, it will be understood that alternative implementations are possible in which only the first signal is used (e.g., see FIG. 1C) or in which more than two signals are used.

Although in the example of FIG. 3 steps 312 and 314 are executed in each iteration of the process 300, it will be understood that steps 312 may and 314 may be executed only until a predetermined convergence criterion is satisfied. The convergence criterion may be satisfied when: (i) the difference between a new value of the gain adjustment coefficient 112 and a current value of the gain adjustment coefficient 112 is less than a first threshold, and/or (ii) when the difference between a new value of the offset adjustment coefficient and a current value of the offset adjustment coefficient is less than a second threshold. However, it will be understood that the present disclosure is not limited to any specific convergence criterion.

Although in the example of FIG. 3 step 314 is performed only when the triggering condition of step 312 is satisfied, it will be understood that alternative implementations are possible in which the execution of step 314 is not subject to any triggering condition being satisfied. Although in the example of FIG. 3 the triggering condition of step 312 is based on the current angular position of the rotating target 101, it will be understood that the present disclosure is not limited to any specific type of triggering condition. For example, in some implementations, the triggering condition of step 312 may be based on time. In such implementations, step 314 may be executed only if a sufficient amount of time has passed since the most recent execution of step 314.

Figure 4:
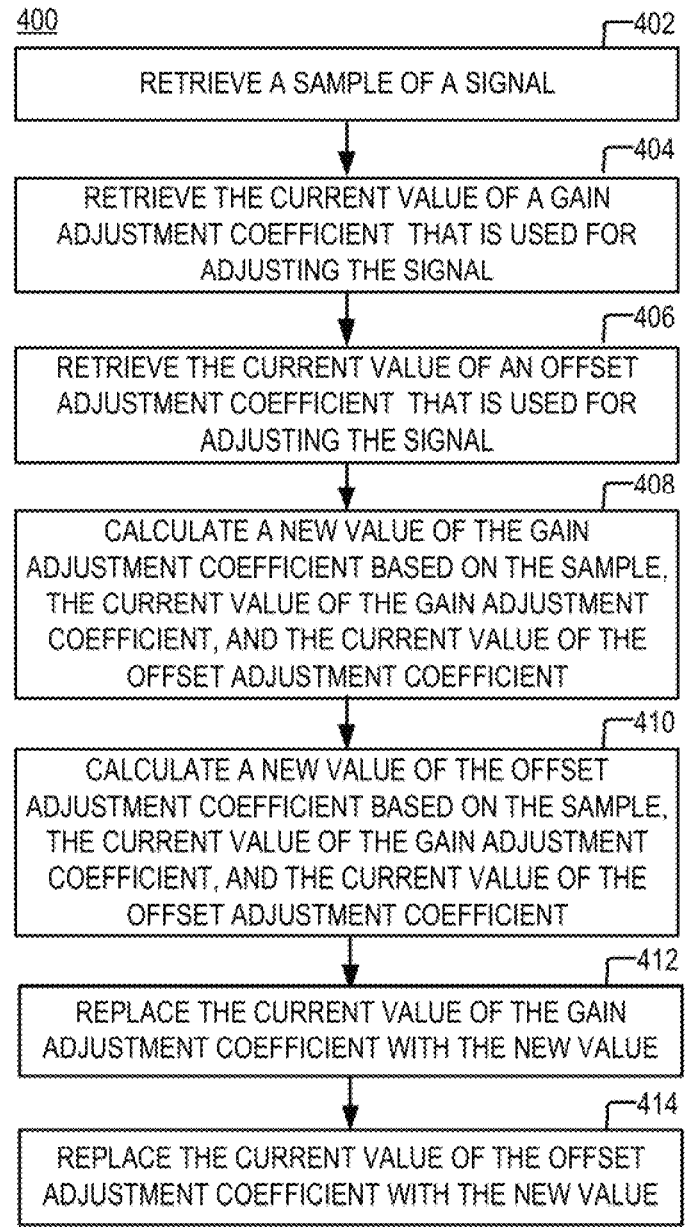
FIG. 4 is a flowchart of an example of a process, according to aspects of the disclosure.

FIG. 4 is a flowchart of an example of a process 400 for updating the values of a gain adjustment coefficient and/or an offset adjustment coefficient, according to aspects of the disclosure.

At step 402, the controller 120 retrieves a sample of a signal. According to the present example, the controller 120 retrieves a sample of the signal 109A.

At step 404, the controller 120 retrieves the current value of a gain adjustment coefficient that is being used to adjust the signal. According to one example, the controller 120 retrieves the current value of the gain adjustment coefficient 112 from the memory 124.

At step 406, the controller 120 retrieves the current value of an offset adjustment coefficient that is being used to adjust the signal. According to the present example, the controller 120 retrieves the current value of the offset adjustment coefficient 114 from the memory 124.

At step 408, the controller 120 calculates a new value for the gain adjustment coefficient that is being used to adjust the signal. The new value is calculated based on the sample (retrieved at step 402), the current value of the gain adjustment coefficient (retrieved at step 404), and the current value of the offset adjustment coefficient (retrieved at step 406). In some implementations, the new value of the gain adjustment coefficient may be calculated using the approach that is discussed above with respect to FIG. 2C. Additionally or alternatively, in some implementations, the new value of the gain adjustment coefficient may be calculated by minimizing a cost function that approximates (or is otherwise based on) the error that is present in the sample (retrieved at step 402). Additionally or alternatively, in some implementations, the new value of the gain adjustment coefficient may be calculated in accordance with function 240, which is discussed above with respect to FIG. 2C.

At step 410, the controller 120 calculates a new value for the offset adjustment coefficient that is being used to adjust the signal. The new value is calculated based on the sample (retrieved at step 402), the current value of the gain adjustment coefficient (retrieved at step 404), and the current value of the offset adjustment coefficient (retrieved at step 406). In some implementations, the new value of the offset adjustment coefficient may be calculated using the approach that is discussed above with respect to FIG. 2C. Additionally or alternatively, in some implementations, the new value of the offset adjustment coefficient may be calculated by minimizing a cost function that approximates (or is otherwise based on) the error that is present in the sample (retrieved at step 402). Additionally or alternatively, in some implementations, the new value of the offset adjustment coefficient may be calculated in accordance with function 240, which is discussed above with respect to FIG. 2.

At step 412, the controller replaces the current value of the gain adjustment coefficient (retrieved at step 404) with the new value of the gain adjustment coefficient (calculated at step 408). According to the present example, replacing the current value of the gain adjustment coefficient with the new value of the gain adjustment coefficient includes overwriting the value of the gain adjustment coefficient 112, which is stored in the memory 124 with the value that is calculated at step 408. As can be readily appreciated, after the new value of the gain adjustment coefficient is written to the memory 124, it becomes the "current" value of the gain adjustment coefficient, and begins to be used by the controller 120 to adjust the gain of the signal 109A.

At step 414, the controller replaces the current value of the offset adjustment coefficient (retrieved at step 404) with the new value of the offset adjustment coefficient (calculated at step 408). According to the present example, replacing the current value of the offset adjustment coefficient with the new value of the offset adjustment coefficient includes overwriting the value of the offset adjustment coefficient 114, which is stored in the memory 124 with the value that is calculated at step 410. As can be readily appreciated, after the new value of the offset adjustment coefficient is written to the memory 124, it becomes the "current" value of the offset adjustment coefficient, and begins to be used by the controller 120 to adjust the offset of the signal 109A.

Figure 5:
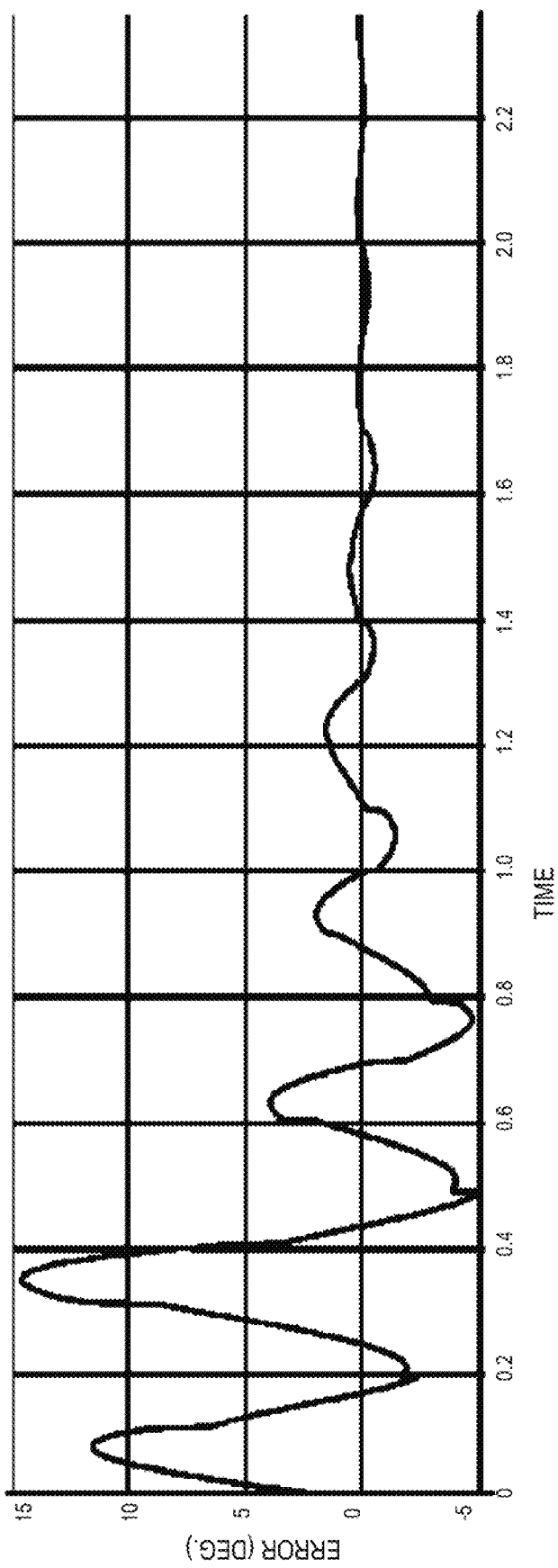
FIG. 5 is a plot illustrating an example of results that can be achieved with the process of FIG. 4, according to aspects of the disclosure.

As noted above, the technique discussed with respect to FIGS. 2A-4 uses gradient descent to repeatedly update the values of the gain adjustment coefficient 112 and the offset adjustment coefficient 114. As the values are updated, the amount of error that is present in the signal 109A is decreased. In this regard, FIG. 5 shows a plot of the error that is present in signal 109A as the values of the gain adjustment coefficient 112 and the offset adjustment coefficient 114 are sequentially updated. The plot shows that as the updating of coefficients 112 and 114 progresses, the error in the signal 109A decreases.

FIG. 6 shows another model for updating different types of adjustment coefficients. FIG. 6 is provided to illustrate that the concepts and ideas discussed above are not limited to the updating of a gain adjustment coefficient or an offset adjust coefficient only, and can be extended to updating any type of adjustment coefficient.

The model of FIG. 6 is based on minimizing the value of cost function 610 with respect to adjustment coefficients $A_c$, $C_c$, $\varphi_c$, $A_{hc}$, where $A_c$ is the current value of a gain adjustment coefficient, $C_c$ is the current value of an offset adjustment coefficient, $\varphi_c$ is the current value of a phase adjustment coefficient, and $A_{hc}$ is the current value of a first-order harmonic adjustment coefficient. Cost function 610 may be defined by Equation 8 below:

$$J(A_c, C_c, \varphi_c, A_{hc}) = \frac{1}{2}(A_c(1 + A_{hc} \sin(2\theta)) \sin(\theta + \varphi_c) + C_c - x)^2 \quad (8)$$

where x represents the value of a signal that is generated at least in part by a magnetic field sensing element in response to a magnetic field corresponding to a rotating target. The signal may be the same or similar to the signal 109A. Cost function 610 may be used as a basis for deriving cost function 210, which is discussed above with respect to FIG. 2C.

A new value for any of the adjustment coefficients $A_c$, $C_c$, $\varphi_c$, $A_{hc}$ may be calculated by using a function 620, which is defined by Equation 9 below:

$$k_n = k_c - \alpha \frac{\partial J}{\partial k} \quad (9)$$

where α is a learning rate coefficient, $K_c \in \{A_c, C_c, \varphi_c, A_{hc}\}$, $K_n \in \{A_n, C_n, \varphi_n, A_{hn}\}$, An is the new value of the gain adjustment coefficient, Cn is the new value of the offset adjustment coefficient, φ is the new value of the phase adjustment coefficient, and $A_{hn}$ is the new value of the first-order harmonic adjustment coefficient. Equation 9 provides that a new value for any of the adjustment coefficients $A_c$, $C_c$, $\varphi_c$, $A_{hc}$ may be calculated by subtracting, from the current value of the same adjustment coefficient, a scaled (by a learning rate coefficient) or non-scaled value of the partial derivative of cost function 610 with respect to that coefficient.

Cost function 610 may be used to determine the value of fewer than all of the offset adjustment coefficient, the gain adjustment coefficient, the first-order harmonic adjustment coefficient, and the phase adjustment coefficient. Equation 10 can be derived from cost function 610, and can be used to update the values of a gain adjustment coefficient, an offset adjustment coefficient, and a phase adjustment coefficient. Similarly, Equation 11 can be derived from cost function 610, and can be used to update a first-order harmonic adjustment coefficient only.

$$J(A_c, C_c, \varphi_c) = \frac{1}{2}(A_c \sin(\theta + \varphi_c) + C_c - x)^2 \quad (10)$$

$$J(A_{hc}) = \frac{1}{2}(A_c(1 + A_{hc} \sin(2\theta))\sin(\theta) + C_c - x)^2 \quad (11)$$

In some implementations, a signal generated, at least in part, by a magnetic field sensing element in response to a magnetic field associated with a rotating target (hereinafter "signal of interest") may be adjusted in accordance with any of Equations 12-14 below. According to the present example the signal of interest is the same or similar to signal 109A.

$$x_a = A_c x_s + C_c \quad (12)$$

$$x_a = A_c(1 + A_{hc} \sin(\theta))x_s + C_c \quad (13)$$

$$x_a = \cos(\varphi)x_s + \sin(\varphi)y_s \quad (14)$$

where $A_c$ is the current value of a gain adjustment coefficient, $C_c$ is the current value of an offset adjustment coefficient, φ is the current value of a phase adjustment coefficient, and $A_{hc}$ is the current value of a first-order harmonic adjustment coefficient, $x_a$ is an adjusted sample of the signal of interest (e.g., the signal 109A), $x_s$ is a raw sample of the signal of interest (e.g., the signal 109A), and $y_s$ is a raw (or adjusted) sample of another signal (e.g., the signal 109B). As noted above, FIG. 6 is provided as an example only, and the present disclosure is not limited to using any specific cost function for updating the values of one or more adjustment coefficients, for as long as the cost function is at least partially indicative of the error that is present in a signal generated by a magnetic field sensing element in response to a magnetic field associated with a rotating target.

FIG. 7 is a flowchart of an example of a process 700 that is performed by the sensor 100, according to aspects of the disclosure. The process 700 may be performed by a controller of a magnetic field sensor, such as the sensor 100. At step 702, a signal is generated that is at least in part indicative of the angular position of a rotating target. By way of example, the signal may be the same or similar to the signal 109A and the rotating target may be the same or similar to the rotating target 101, both of which are discussed above with respect to FIGS. 1A-C. At step 704, the signal is adjusted to produce an adjusted signal. The signal may be adjusted based on an adjustment coefficient. The adjustment coefficient may include any suitable type of adjustment coefficient. The adjustment coefficient may include a gain adjustment coefficient, an offset adjustment coefficient, a phase adjustment coefficient, a first-order harmonic adjustment coefficient, a second-order harmonic adjustment coefficient, a third-order harmonic adjustment coefficient, a fourth-order harmonic adjustment coefficient, and other features describing error patterns. At step 706, an output signal is generated that is at least in part indicative of the angular position of the rotating target. The output signal may be the same or similar to the output signal 171, which is discussed above with respect to FIGS. 1A-C. At step 708, a determination is made if the current angular position of the rotating target matches any angular position in the set of one or more angular positions. Step 708 may be performed in the manner discussed with respect to step 312 of the process 300 (shown in FIG. 3). At step 710, the adjustment coefficient is updated. In some implementations, the adjustment coefficient may be updated by executing a process 800, which is discussed further below with respect to FIG. 8.

FIG. 8 is a flowchart of an example of a process 800 for updating an adjustment coefficient, according to aspects of the disclosure. The process 800 may be performed by a controller of a magnetic field sensor, such as the sensor 100. At step 802, a sample of a signal is retrieved. The signal may be the same or similar to the signal 109A, which is discussed with respect to FIGS. 1A-C. At step 804, the controller 120 retrieves the current of an adjustment coefficient that is used to adjust the signal (either before or after the signal is sampled). The adjustment coefficient may include any suitable type of adjustment coefficient. The adjustment coefficient may include a gain adjustment coefficient, an offset adjustment coefficient, a phase adjustment coefficient, a first-order harmonic adjustment coefficient, a second-order harmonic adjustment coefficient, a third-order harmonic adjustment coefficient, a fourth-order harmonic adjustment coefficient, etc. At step 806, the controller 120 calculates a new value for the adjustment coefficient. By way of example, the new value may be calculated by minimizing a cost function, such as the cost function 610 (which is shown in FIG. 6). However, it will be understood that the present disclosure is not limited to using any specific type of cost function. At step 808, the current value of the adjustment coefficient is replaced with the new value of the adjustment coefficient. Replacing the current value of the adjustment coefficient may include overwriting (in memory) the current value of the adjustment coefficient with the new value of the adjustment coefficient.

The term "unit" as used throughout the present disclosure shall refer to an electronic component and/or an electronic circuit that include one or more electronic components. In some implementations, the electronic components may include analog components (e.g., electronic components that operate in the analog domain). Additionally or alternatively, in some implementations, the electronic components may include digital logic and/or electronic components that operate in the digital domain. Additionally or alternatively, in some implementations, the electronic components may include digital logic that is configured to execute a sensor firmware. It will be understood that the meaning of the term "compensation unit" includes, but not limited to the examples provided throughout the disclosure. It will be understood that the meaning of the term "conditioning unit" includes, but not limited to the examples provided throughout the disclosure. It will be further understood that the meaning of the term "offsetting unit" includes, but not limited to the examples provided throughout the disclosure. It will be further understood that the meaning of the term "de-offsetting unit" includes, but not limited to the examples provided throughout the disclosure. Stated succinctly, the term "unit," as used throughout the disclosure is not intended to be construed as means-plus-function language.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (In·Sb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A method for use in a sensor, comprising:
generating a signal in response to a magnetic field that is associated with a rotating target, the signal being generated by at least one magnetic field sensing element;
adjusting the signal to produce an adjusted signal, the signal being adjusted based on a current value of an adjustment coefficient;
and
updating the adjustment coefficient, the updating including replacing the current value of the adjustment coefficient with a new value of the adjustment coefficient, the updating being performed by minimizing a function that is based on the current value of the adjustment coefficient,
wherein the adjustment coefficient includes a gain adjustment coefficient, and the function has the form of:

$$J(A_c, C_c, \varphi, A_{hc}) = \frac{1}{2}(A_c(1 + A_{hc} \sin (2\theta)) \sin (\theta + \varphi_c) + C_c - x)^2$$

where $A_c$ is the current value of the gain adjustment coefficient, $C_c$ is a current value of an offset adjustment coefficient, $\theta$ is a current angular position of the rotating target, $A_h$ is a current value of a harmonic adjustment coefficient, $\varphi_c$ is a current value of a phase adjustment coefficient, and x is a sample of the signal;
wherein updating the adjustment coefficient causes a processing circuitry of the sensor to begin using the new value for adjusting the signal, and
wherein the adjusted signal is used by the processing circuitry of the sensor to generate an output signal that is indicative of at least one of position or a characteristic of movement of the rotating target.

2. The method of claim 1, wherein the offset adjustment coefficient is also updated by minimizing the function.

3. The method of claim 1, wherein the function is based on an error that is present in an arbitrary sample of the signal or in multiple samples of the signal.

4. The method of claim 1, wherein the adjustment coefficient is updated based on a derivative of the function with respect to the adjustment coefficient.

5. The method of claim 1, wherein the updating of the adjustment coefficient is triggered by the signal having a value that is associated with a predetermined angular position.

6. The method of claim 1, wherein:
the rotating target includes at least one of a magnet, a gear, a ring-magnet, and a rotor of an electric motor; and
the magnetic field sensing element includes at least one of a Hall effect element, a giant magnetoresistor (GMR), or a tunnel magnetoresistor (TMR).

7. A method for use in a sensor, comprising:
generating a signal in response to a magnetic field that is associated with a rotating target, the signal being generated by at least one magnetic field sensing element;

adjusting the signal to produce an adjusted signal, the signal being adjusted based on a current value of a first adjustment coefficient and a current value of a second adjustment coefficient, the first adjustment coefficient including a gain adjustment coefficient, and the second adjustment coefficient including an offset adjustment coefficient;

and updating the first adjustment coefficient, the updating including replacing the current value of the first adjustment coefficient with a new value of the first adjustment coefficient, the updating being performed by minimizing a function that is based on the current value of the first adjustment coefficient and the current value of the second adjustment coefficient;

wherein updating the first adjustment coefficient causes a processing circuitry of the sensor to begin using the new value for adjusting the signal, and wherein the adjusted signal is used by the processing circuitry of the sensor to generate an output signal that is indicative of at least one of position or a characteristic of movement of the rotating target.

8. The method of claim 7, wherein the function is based on an error that is present in an arbitrary sample of the signal or in multiple samples of the signal.

9. The method of claim 7, wherein the first adjustment coefficient is updated based on a derivative of the function with respect to the first adjustment coefficient.

10. The method of claim 7, wherein the updating of the first adjustment coefficient is triggered by the signal having a value that is associated with a predetermined angular position.

11. The method of claim 7, wherein the second adjustment coefficient is also updated by minimizing the function.

12. A sensor, comprising:

at least one magnetic field sensing element that is arranged to generate a signal in response to a magnetic field that is associated with a rotating target; and a processing circuitry configured to:

adjust the signal to produce an adjusted signal, the signal being adjusted based on a current value of an adjustment coefficient;

and update the adjustment coefficient, the updating including replacing the current value of the adjustment coefficient with a new value of the adjustment coefficient, the updating being performed by minimizing a function that is based on the current value of the adjustment coefficient, wherein the adjustment coefficient includes a gain adjustment coefficient, and the function has the form of:

$$J(A_c, C_c, \varphi, A_{hc}) = \frac{1}{2}(A_c(1 + A_{hc}\sin(2\theta))\sin(\theta + \varphi_c) + C_c - x)^2$$

where $A_c$ is the current value of the gain adjustment coefficient, $C_c$ is a current value of an offset adjustment coefficient, $\theta$ is a current angular position of the rotating target, $A_h$ is a current value of a harmonic adjustment coefficient, $\varphi_c$ is a current value of a phase adjustment coefficient, and x is a sample of the signal;

wherein updating the adjustment coefficient causes the processing circuitry to begin using the new value for adjusting the signal, and wherein the adjusted signal is used by the processing circuitry of the sensor to generate an output signal that is indicative of at least one of position or a characteristic of movement of the rotating target.

13. The sensor of claim 12, wherein the offset adjustment coefficient is also updated by minimizing the function.

14. The sensor of claim 12, wherein the function is based on an error that is present in an arbitrary sample of the signal or in multiple samples of the signal.

15. The sensor of claim 12, wherein the adjustment coefficient is updated based on a derivative of the function with respect to the adjustment coefficient.

16. The sensor of claim 12, wherein the updating of the adjustment coefficient is triggered by the signal having a value that is associated with a predetermined angular position.

17. The sensor of claim 12, wherein:

the rotating target includes at least one of a magnet, a gear, a ring-magnet, and a rotor of an electric motor; and the magnetic field sensing element includes at least one of a Hall effect element, a giant magnetoresistor (GMR), or a tunnel magnetoresistor (TMR).

18. A sensor, comprising:

at least one magnetic field sensing element that is arranged to generate a signal in response to a magnetic field that is associated with a rotating target; and a processing circuitry configured to:

adjust the signal to produce an adjusted signal, the signal being adjusted based on a current value of a first adjustment coefficient and a current value of a second adjustment coefficient, the first adjustment coefficient including a gain adjustment coefficient, and the second adjustment coefficient including an offset adjustment coefficient;

and update the first adjustment coefficient, the updating including replacing the current value of the first adjustment coefficient with a new value of the first adjustment coefficient, the updating being performed by minimizing a function that is based on the current value of the first adjustment coefficient and the current value of the second adjustment coefficient, wherein updating the first adjustment coefficient causes a processing circuitry to begin using the new value for adjusting the signal, and wherein the adjusted signal is used by the processing circuitry of the sensor to generate an output signal that is indicative of at least one of position or a characteristic of movement of the rotating target.

19. The sensor of claim 18, wherein the function is based on an error that is present in an arbitrary sample of the signal or in multiple samples of the signal.

20. The sensor of claim 18, wherein the first adjustment coefficient is updated based on a derivative of the function with respect to the first adjustment coefficient.

21. The sensor of claim 18, wherein the updating of the first adjustment coefficient is triggered by the signal having a value that is associated with a predetermined angular position.

22. The sensor of claim 18, wherein the second adjustment coefficient is also updated by minimizing the function.

23. The sensor of claim 18, wherein:

the rotating target includes at least one of a magnet, a gear, a ring-magnet, and a rotor of an electric motor; and the magnetic field sensing element includes at least one of a Hall effect element, a giant magnetoresistor (GMR), or a tunnel magnetoresistor (TMR).

\* \* \* \* \*